(12) United States Patent
Chen

(10) Patent No.: US 6,492,196 B1
(45) Date of Patent: Dec. 10, 2002

(54) PACKAGING PROCESS FOR WAFER LEVEL IC DEVICE

(75) Inventor: Tsung-Chieh Chen, Taipei (TW)

(73) Assignee: PICTA Technology Inc., Taipei (TW)

( * ) Notice: Subject to any disclaimer, the term of this patent is extended or adjusted under 35 U.S.C. 154(b) by 0 days.

(21) Appl. No.: 10/036,524

(22) Filed: Jan. 7, 2002

(51) Int. Cl.$^7$ .............................................. H01L 21/44
(52) U.S. Cl. ........................ 438/106; 438/110; 438/113
(58) Field of Search ................................ 438/106, 110, 438/113, 114

(56) References Cited

U.S. PATENT DOCUMENTS

| | | | |
|---|---|---|---|
| 6,235,552 B1 * | 5/2001 | Kwon et al. ................. | 438/106 |
| 6,376,279 B1 * | 4/2002 | Kwon et al. ................. | 257/772 |
| 6,379,999 B1 * | 4/2002 | Tanabe ........................ | 257/684 |
| 6,387,795 B1 * | 5/2002 | Shao ....................... | 228/180.21 |
| 6,413,799 B1 * | 7/2002 | Lam ........................... | 438/113 |

* cited by examiner

Primary Examiner—Trung Dang
(74) Attorney, Agent, or Firm—Troxell Law Office PLLC

(57) ABSTRACT

The provision of a semiconductor wafer, which has been formed with a plurality of chips that each can be existent independently; the pre-cure process, in which the buffer layer has not been completely baked or hardened yet, but just for making the buffer layer be in stable condition; the pre-cut process, in which a cut is made at the position of the buffer layer corresponding to the boundary of each IC to make a gap exited between each two adjacent ICs without containing any buffer layer; the post-cut process, in which the buffer layer has completely baked and hardened; the singulation process, in which the both wafer and buffer layer are cut simultaneously to make the plural ICs separated from each other to become IC device that can act independently. Since the invention has processed pre-cut before the complete hardening, so when processing the complete bake, because there is pre-remaining space available for the buffer layer for thermal expansion, it can reduce the stress applied on the wafer to further keep the completeness of the wafer.

8 Claims, 4 Drawing Sheets

PACKAGING PROCESS FOR WAFER LEVEL IC DEVICE

BACKGROUND OF THE INVENTION

1. Field of the Invention

The invention relates to a packaging method for the wafer level IC device, especially to a kind of packaging method for IC device just by applying the traditional wafer process and the BGA packaging technology completely without any additional special wafer process to fulfill the merits of smaller size and thinner thickness in the same packaging volume as that of the IC device produced by the Wafer Level Packaging technology.

2. Background of the Invention

For packaging an IC device, except a traditional lead frame is needed as signal connection interface between the IC chip and the outside such as circuit board or motherboard, another kind of electric connection medium with metal ball (e.g. solder ball) such as common BGA is also available. However, for both the lead frame package of prior arts or the BGA package, they all have the shortcoming that the size of the packaging device is larger relatively. Because their package/chip ratio is at least larger than 1.6, it causes a lot of waste on space, and for the electronic industry requiring fineness, it cannot fulfill the requirement of micronization trend.

Accordingly, the semiconductor industry now has developed a so-called "Chip Scale Package, CSP" technique to make the package/chip ratio of the IC device lower than 1.2. Further, relative industry combines the package process directly with wafer process to create a so-called "Wafer Level IC Device Packaging Technique", by which the process produces IC package device, size of which is almost same as that of the original chip. Therefore, it promotes the package/chip ratio close to 1 for extremely avoiding the waste of space possibly caused by the traditional package.

Please refer to FIG. 1, which shows a wafer level IC packaging device 1. Plural ICs (not shown in the figure) that are belonged to the front end of semiconductor process and can be existed independently have already formed. For the active side of the wafer 11 of the wafer level IC packaging device 1, on which there are mainly formed: patterned metal layer 13, several pads 16 (Al pad, in ordinary), several metal posts 17 (copper posts, in general), resin layers 12a, 12b, and solder ball pad 12b that is extended from the IC of the wafer 11 and is applied for welding solder ball 15. Finally, the solder ball 15 of the wafer level IC packaging device 1 is welded onto a circuit board (commonly known as SMT process, or called [ on board ] step, which are not shown in the figures).

However, the wafer level IC packaging device 1 is cut entirely to make the wafer 11 separated into several ICs that each one is independently existent. Before the wafer 11 being cut, it will be cured through the step of appropriate bake. At this time, since the coefficient of thermal expansion (abbreviated as CTE) of the resin layer 12 made as buffer layer has some level of difference from that of the wafer 11 after all, so the wafer 11 will be deformed due to the excess stress caused by the differences of expansion situation among several kinds of materials during baking process. Even more seriously, the wafer 11 will be incurred the situations of break and damage to cause the yield of product unable to be promoted effectively.

However, in the common semiconductor industry, when the wafer level IC packaging device 1 is welded onto the circuit board (SMT process), since the coefficient of thermal expansion of the buffer layer is different from that of the circuit board, so the wafer 1 is incurred damaging situation. In order to increase the yield of product, they make their efforts on the design of the buffer. However, they do not know that the wafer 11 still will be incurred the situation of damage even in the baking process at the front end. When the size of wafer is developed from 8 inch to 12 inch, because the number of designed chip is increased greatly, this kind of damaging situation is further serious. According to this, the invention specially provides an innovative packaging process of the wafer level IC device for solving aforementioned problem thoroughly.

SUMMARY OF THE INVENTION

Thus, the main object of the invention is to provide a packaging process for a wafer level IC device. During the wafer being baked, the invention will prevent it from deformation caused by the different stresses incurred from the wafer due to the coefficient of thermal expansion of the buffer layer being somewhat different from that of the wafer. The invention can raise the yield of product effectively, however, without relatively increasing the cost and needed technology of package.

A further object of the invention is to provide a packaging method for a wafer level IC device. Since the invention processes pre-cut before bake, so a gap is created between each two adjacent ICs without existence of any buffer layer. Therefore, when a complete bake is under processing, since a pre-remained space can be provided for the thermal expansion of the buffer layer, so the stress subjected by the wafer during thermal expansion can be reduced and the completeness of the wafer is remained.

To reach above-mentioned objects, a preferable embodiment of the packaging process of the wafer level IC device according to the invention is comprised of following steps:

a. Device preparation: a wafer produced from common semiconductor process is prepared, wherein plural chips capable of independent existence have already formed on one active side of the wafer by the semiconductor process. Each chip all has its own IC action independently. There is patterned metal layer formed on each independent IC, on which a pad is also arranged for electric connection point. Further, a buffer layer is coated on the wafer.

b. Pre-cure step: the buffer layer has not completely hardened yet for the time being by baking with appropriate temperature and just has reached a stable condition sufficiently.

c. Pre-cut step: a cut is made at the position of the buffer corresponding to the boundary of each IC device to make a gap existed between each two adjacent IC devices without containing any buffer layer.

d. Post-cure step: the buffer layer is baked completely to make itself hardened completely with appropriate temperature.

e. Metal ball implant: plural metal balls are implanted for coupling with the solder ball pads on the side surface of the buffer layer that is far away from the wafer.

f. Singulation: the wafer together with the buffer layer are under singulation process to make the plural ICs (chips) separated from each other to become IC device that each can act independently.

Wherein, in the mean time, since the invention has completed the pre-cut before being completely hardened to create a gap existed between each two adjacent IC devices without containing any buffer layer, so when the complete bake is under process, due to the pre-remaining space being available for the buffer layer for thermal expansion, the stress caused by the thermal expansion and subjected by the wafer can be reduced and the completeness of the wafer is remained.

DETAILED DESCRIPTION OF THE PREFERRED EMBODIMENTS

Figure 1:
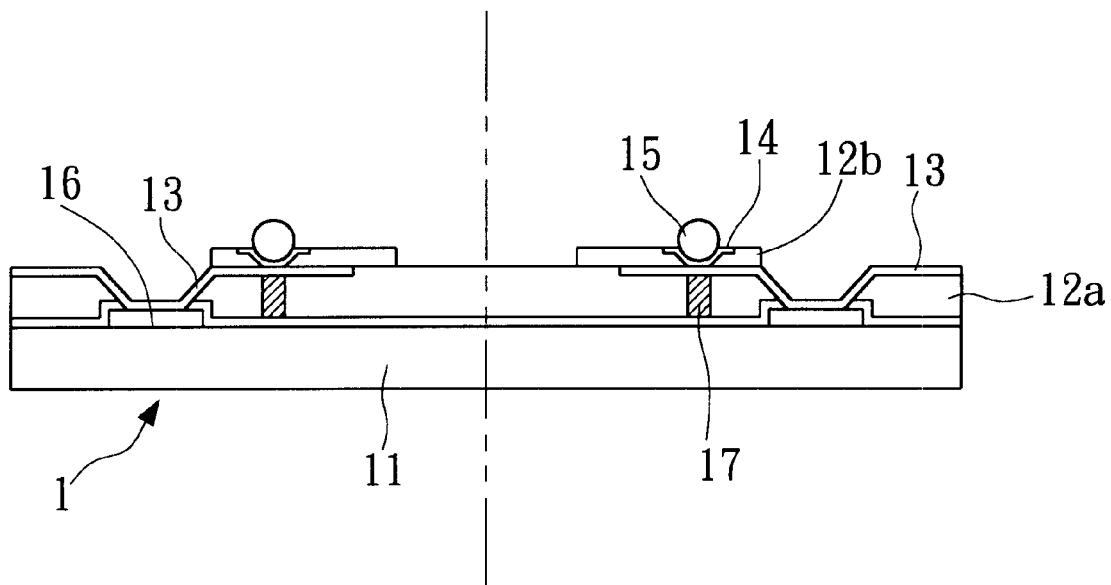
FIG. 1 is an illustration for the wafer level IC packaging device according to the prior arts.

The invention is mainly applied in packaging the device of the wafer level IC and can just avoid the problem incurred in the packaging process, namely, the damage situation incurred possibly due to the difference of CTE for both buffer layer and wafer, completely without any special wafer process additionally. As shown in FIG. 2A to FIG. 2D, which is a preferable embodiment for packaging the device for the wafer level IC according to the present invention. The packaging process for the wafer level IC device according to the present invention is comprised of following steps:

1. Device preparation: please refer to FIG. 1, which shows a wafer 101 prepared by a common semiconductor process, wherein plural chips that each can be existent independently have already formed on one active side of the wafer 101. Each chip has its own IC that can act independently. One single layer or plural layers of patterned metal layer 102a are formed on each independent IC. There are plural pads 104 arranged on the predetermined positions and applied as electric joints (each is just shown as a pad in the figure) for IC coupling with the outside. Said pad 104 generally is an Al pad and has a buffer layer 103 adhered over the wafer 101. The buffer layer 103 may be non-conducting material such as resin or epoxy, etc. Metal layer 102b and plural metal posts 105 may be defined on the buffer layer 103. The metal post 105 may be material of copper post. Outside the metal post 105, there is a solder ball pad 106 extended from the metal layer 102b.

2. Pre-cure step: for the time being, the buffer layer 103 is not completely hardened by incomplete bake with appropriate temperature, but the buffer layer 103 is just baked to a degree sufficiently to be in a stable condition.

Figure 2A:
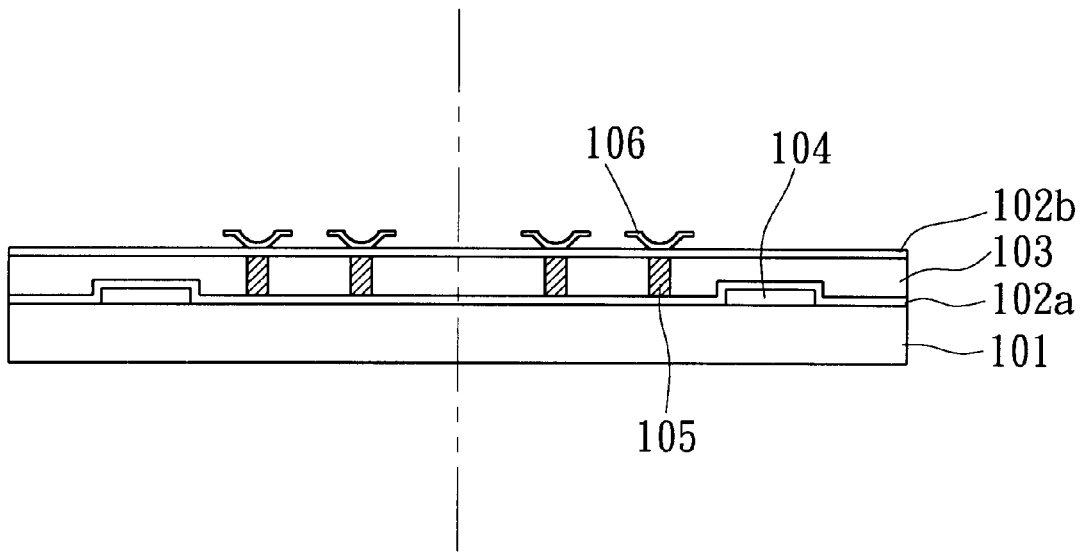
FIGS. 2A–2D are the illustrations for the packaging processes of the preferable embodiment of the wafer level IC device according to the present invention.
Figure 2B:
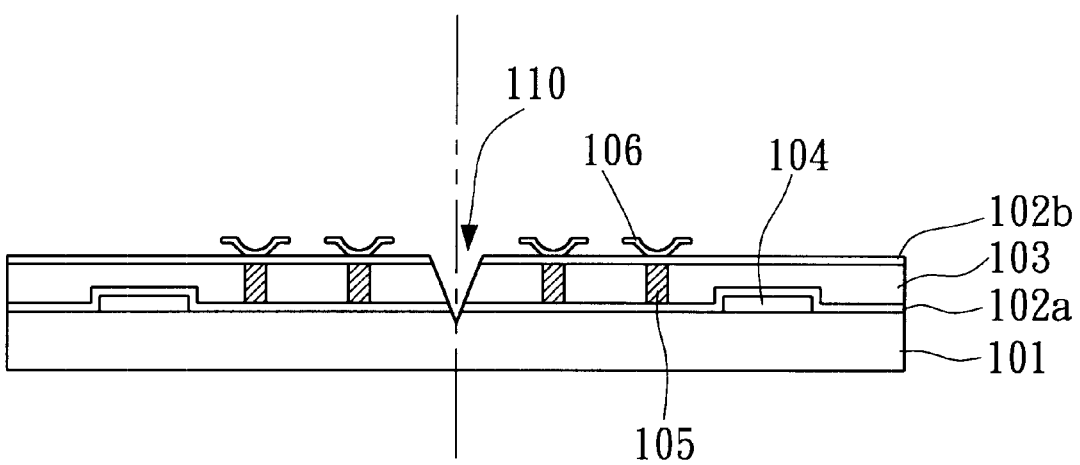

3. Pre-cut step: this is the main point of the invention, wherein a cut is made at the position of the buffer layer 103 corresponding to the boundary of each IC to make a gap existed between each two adjacent ICs without containing any buffer layer 103. Wherein, said cut may be slightly extended into the boundary of each IC, as shown in FIG. 2B.

4. Post-cure step: the buffer layer 103 applied for adhesion is baked completely to be sufficiently hard with appropriate temperature. At this time, since the pre-cut has already been processed in aforementioned step according to the present invention and a gap 110 is made between each two adjacent ICs without containing any buffer layer, so during the process of complete bake, because of a pre-remaining space available for the buffer layer 103 for thermal expansion, the stress subjected by the wafer due to thermal expansion can be reduced and the completeness of the wafer 101 can be maintained.

Figure 2C:
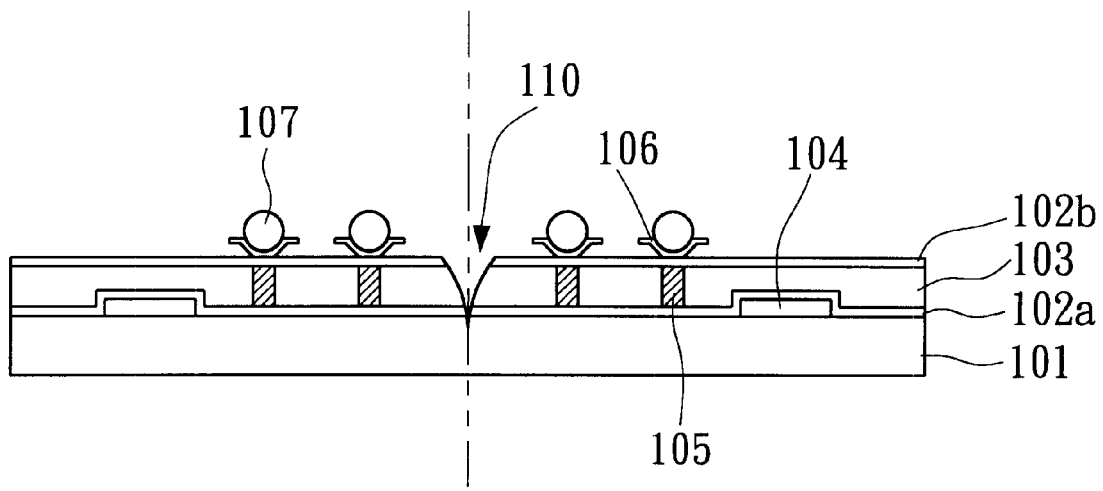
Figure 2D:
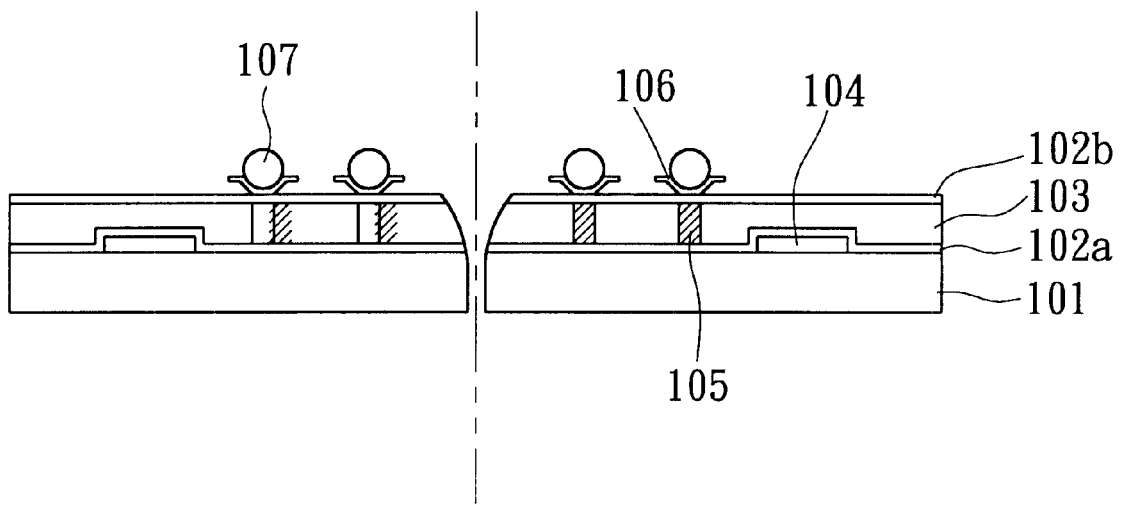

5. Metal ball implant: as shown in FIG. 2C, wherein plural metal balls 107 are implanted on the side surface of the buffer layer 103 far away from the wafer 101 and are coupled with the solder ball pads 106. Wherein, the metal ball 107 is preferably a solder ball.

6. Singulation: as shown in FIG. 3D, wherein both the wafer 101 and buffer layer 103 are cut simultaneously to make the plural ICs (chips) separated from each other to become an IC device that can act independently.

Figure 3:
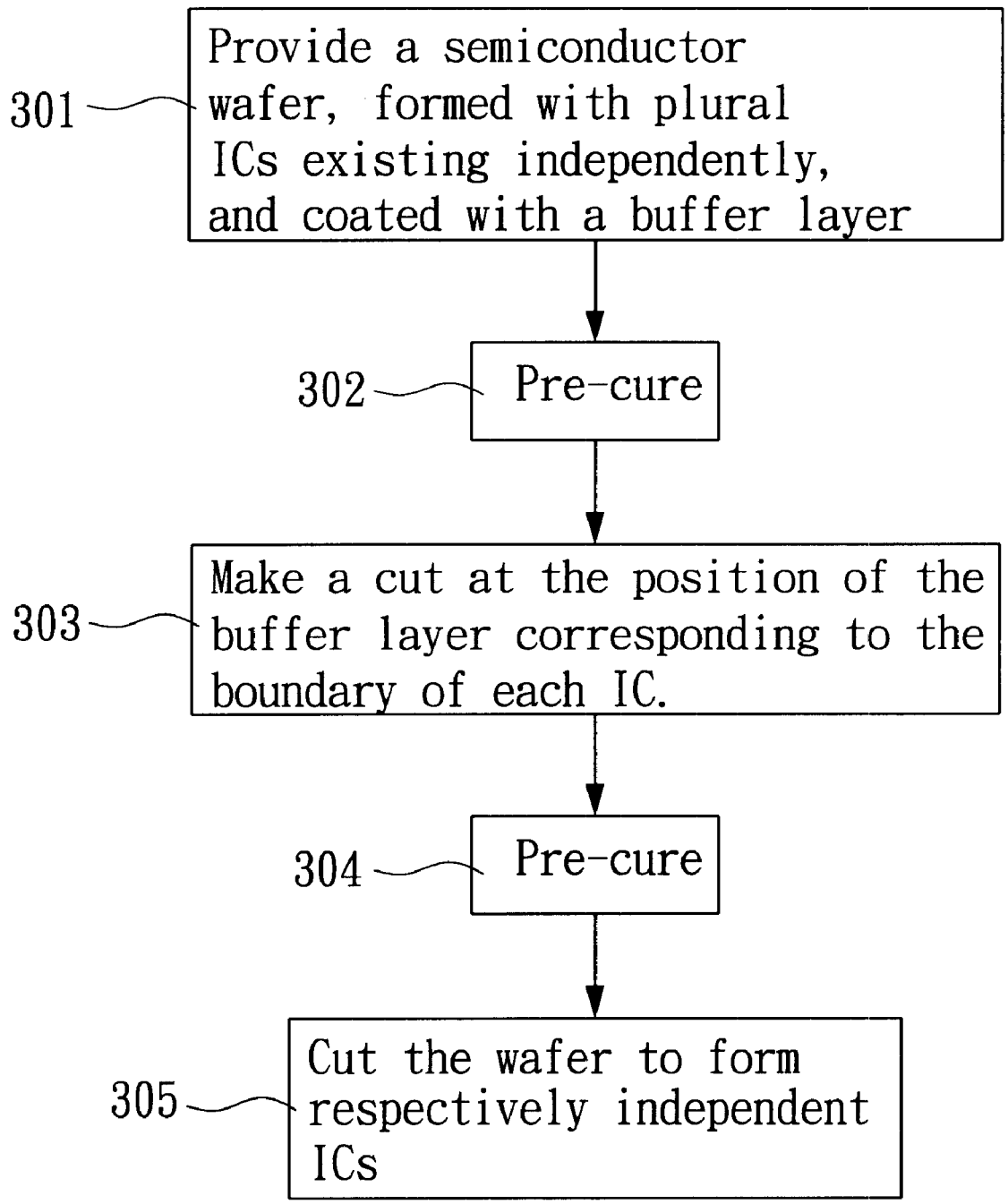
FIG. 3 is a flowchart for the packaging processes of the preferable embodiment of the wafer level IC device according to the present invention.

To make the process of the invention be understood more easily, FIG. 3 is a flowchart for a preferable embodiment of the packaging process of the wafer level IC device according to the present invention. Its flow path is comprised of:

(301) Provide a wafer made by the process of semiconductor. Plural chips that each can be existent independently have already been formed on one active side of the wafer by the process of semiconductor. Each chip has its own IC that can act independently and there is a buffer layer adhered over the wafer.

(302) Process the pre-cure step. The buffer layer is baked appropriately, but for the time being, it is not completely hardened by the incomplete bake to be just enough to become a stable condition.

(303) Process the pre-cut step. A cut is made at the position of the buffer layer corresponding to the boundary of each IC to make a gap existed between each two adjacent ICs without containing any buffer layer.

(304) Process the post-cure step. The buffer layer applied for adhesion is baked completely to become sufficiently hard. Since there is pre-remaining space available for the buffer layer for thermal expansion due to a gap existed between each two adjacent ICs, so the stress subjected by the wafer during thermal expansion is reduced to make the wafer maintained in complete shape.

(305) Singulation. Both the wafer and the buffer layer are cut simultaneously to make the plural ICs separated from each other to become IC device that each can act independently. Of course, there is still a step of implanting metal ball, which is not the main point of the invention, so repetitious description is not presented herein any more.

Compared with the prior arts, the invention at least includes following merits:

1. The packaging process of the wafer level IC device according to the invention is simple and not complicated. All those who are skilled in such arts can implement it completely.

2. The wafer of the present invention, during baking, will not be deformed by the excess stress caused by the difference of some level of the CTE between the wafer and the buffer layer to make the yield of product promoted effectively.

It may thus be seen that the objects of the present invention set forth herein, as well as those made apparent from the foregoing description, are efficiently attained. While the preferred embodiments of the invention have been set forth for purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A packaging process for the wafer level IC device, which including following steps:
   a. providing a semiconductor wafer, in which plural ICs that each one can exist independently have formed, and over which a buffer layer is adhered;
   b. processing a pre-cure step to make the wafer cured;
   c. making a cut at the position of the buffer layer corresponding to the boundary of each IC to make a gap existed between each two adjacent ICs without containing any buffer layer;
   d. processing a post-cure step;
   e. processing a singulation step for the semiconductor wafer to make said plural ICs separated from each other to become independent IC device.

2. The packaging process of the wafer level IC device according to claim 1, wherein each IC of said semiconductor wafer is respectively arranged with plural pads at predetermined positions as electric joints for coupling the IC with outside.

3. The packaging method of the wafer level IC device according to claim 1, wherein said buffer layer is a resin layer.

4. The packaging method of the wafer level IC device according to claim 1, wherein said buffer layer has defined plural metal posts.

5. The packaging method of the wafer level IC device according to claim 4, wherein said metal post may be a copper post.

6. The packaging method of the wafer level IC device according to claim 1, wherein a step (e1) is further included after said step (e): implanting plural metal balls for coupling themselves on the side surface of the buffer layer far away the wafer.

7. The packaging method of the wafer level IC device according to claim 6, wherein said metal ball is a solder ball.

8. The packaging method of the wafer level IC device according to claim 1, wherein said cut is slightly extended into the boundary of each IC.

* * * * *